(12) United States Patent
Morikita et al.

(10) Patent No.: US 12,347,645 B2
(45) Date of Patent: Jul. 1, 2025

(54) SUBSTRATE PROCESSING METHOD AND SUBSTRATE PROCESSING APPARATUS

(71) Applicant: Tokyo Electron Limited, Tokyo (JP)

(72) Inventors: Shinya Morikita, Miyagi (JP); Akira Hidaka, Miyagi (JP); Shu Kino, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 482 days.

(21) Appl. No.: 17/532,026

(22) Filed: Nov. 22, 2021

(65) Prior Publication Data

US 2022/0344128 A1 Oct. 27, 2022

Related U.S. Application Data

(60) Provisional application No. 63/180,274, filed on Apr. 27, 2021.

(51) Int. Cl.
| | |
|---|---|
| *H01J 37/32* | (2006.01) |
| *H01L 21/02* | (2006.01) |
| *H01L 21/3065* | (2006.01) |
| *H01L 21/311* | (2006.01) |

(52) U.S. Cl.
CPC ...... *H01J 37/32091* (2013.01); *H01J 37/321* (2013.01); *H01J 37/32449* (2013.01); *H01L 21/0212* (2013.01); *H01L 21/02274* (2013.01); *H01L 21/3065* (2013.01); *H01L 21/31116* (2013.01); *H01J 2237/3321* (2013.01); *H01J 2237/334* (2013.01)

(58) Field of Classification Search
None
See application file for complete search history.

(56) References Cited

U.S. PATENT DOCUMENTS

2016/0379841 A1* 12/2016 Hidaka ............ H01L 21/31144 438/714
2019/0027372 A1* 1/2019 Tsuji ................. H01L 29/66795

FOREIGN PATENT DOCUMENTS

| JP | 2020011918 A | 1/2020 |
| JP | 2020-119918 A | 8/2020 |

* cited by examiner

*Primary Examiner* — Stephanie P Duclair
(74) *Attorney, Agent, or Firm* — XSENSUS LLP (57) ABSTRACT

A substrate processing method is for processing a substrate that includes a first region and a second region with compositions different from each other. The substrate processing method includes (a) preferentially forming, by a substrate processing apparatus, a first deposit on the first region; (b) forming, after (a), a second deposit on the second region, the second deposit containing fluorine and the second deposit being different from the first deposit; and (c) removing, after (b), the second deposit and at least a part of the second region. The steps (a)-(c) are repeated, in order, in a case that a stop condition is not satisfied.

18 Claims, 11 Drawing Sheets

SUBSTRATE PROCESSING METHOD AND SUBSTRATE PROCESSING APPARATUS

CROSS-REFERENCE TO RELATED APPLICATION

This application is related to U.S. Provisional Application Ser. No. 63/180,274 filed on Apr. 27, 2021, the entire contents of which are incorporated by reference herein.

TECHNICAL FIELD

The present disclosure is directed to a substrate processing method, a substrate processing apparatus, and a substrate processing system for selectively protecting a first region of a substrate while etching a second region of the substrate.

BACKGROUND

Conventionally, manufacturing electronic devices perform selective substrate etching. While a first region of a substrate is being protected, a second region of the substrate is to be etched selectively. In some processes, a second region formed from silicon oxide are selectively etched with respect to a first region formed from silicon nitride. These processes use a fluorocarbon deposited on the first region and the second region of the substrate. The fluorocarbon deposited on the first region is used for protecting the first region, and the fluorocarbon deposited on the second region is used for etching the second region.

SUMMARY

In an exemplary implementation of the present disclosure, a substrate processing method for processing a substrate, which includes including a first region and a second region with compositions different from each other, is provided. The substrate processing method comprises (a) preferentially forming, by a substrate processing apparatus, a first deposit on the first region; (b) forming, after (a), a second deposit on the second region, the second deposit containing fluorine and the second deposit being different from the first deposit; and (c) removing, after (b), the second deposit and at least a part of the second region, wherein the steps (a)-(c) are repeated, in order, in a case that a stop condition is not satisfied.

DETAILED DESCRIPTION OF THE DRAWINGS

Exemplary embodiments will now be described in detail with reference to the drawings. In the drawings, similar or corresponding components are indicated by like reference numerals. The embodiments are illustrated by way of example and not by way of limitation in the accompanying drawings that are not to scale unless otherwise indicated.

Reference throughout the specification to "one embodiment" or "an embodiment" means that a particular feature, structure, characteristic, operation, or function described in connection with an embodiment is included in at least one embodiment of the disclosed subject matter. Thus, any appearance of the phrases "in one embodiment" or "in an embodiment" in the specification is not necessarily referring to the same embodiment. Further, the particular features, structures, characteristics, operations, or functions may be combined in any suitable manner in one or more embodiments. Further, it is intended that embodiments of the disclosed subject matter can and do cover modifications and variations of the described embodiments.

It must be noted that, as used in the specification and the appended claims, the singular forms "a," "an," and "the" include plural referents unless the context clearly dictates otherwise. That is, unless clearly specified otherwise, as used herein the words "a" and "an" and the like carry the meaning of "one or more." Additionally, it is to be understood that terms such as "left," "right," "top," "bottom," "front," "rear," "side," "height," "length," "width," "upper," "lower," "interior," "exterior," "inner," "outer," and the like that may be used herein, merely describe points of reference and do not necessarily limit embodiments of the disclosed subject matter to any particular orientation or configuration. Furthermore, terms such as "first," "second," "third," etc., merely identify one of a number of portions, components, points of reference, operations and/or functions as described herein, and likewise do not necessarily limit embodiments of the disclosed subject matter to any particular configuration or orientation.

The present disclosure uses "recess" as a type of etched feature throughout the present disclosure, and the two terms (recess and etched feature) will be used interchangeably herein. Moreover, the term "recess" is not limiting, and could be a hole, slit, groove, concave void or other type of engraved pattern in the substrate material being etched.

Figure 1A:
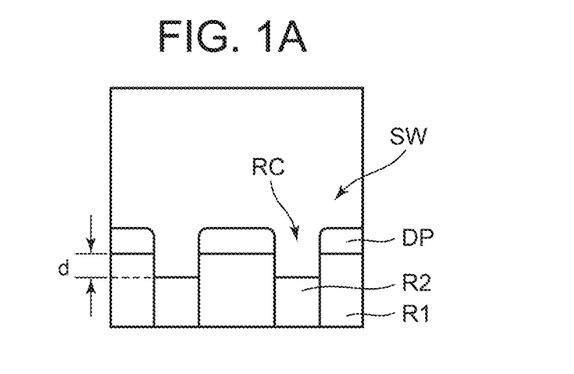
FIG. 1A shows a substrate with first and second regions having a depth of recess therebetween.

FIG. 1A shows an exemplary substrate with first and second regions having a depth of recess therebetween. In particular, substrate SW includes first region R1 and second region R2. In an exemplary implementation, first region R1 is formed from silicon nitride, and the second region R2 is formed from silicon oxide.

Deposit DP is formed on first region R1 and a recess RC is between first region R1 and second region R2. A depth of recess d of the recess RC is shown. In an exemplary implementation, deposit DP is formed on the substrate SW using a mixture of a CO gas and an Ar gas as a process gas. In other implementations, deposit DP may be formed on substrate SW using a mixture of a CH3F gas and an Ar gas.

Figure 1B:
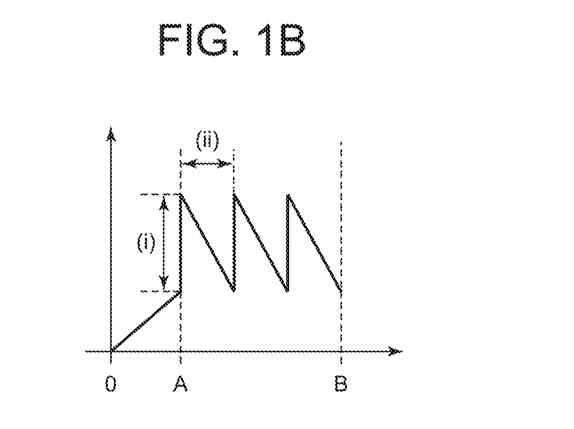
FIG. 1B shows a chart of a depth of recess compared to a deposition amount in a first region of the substrate shown in FIG. 1A and etched according to a comparative process.

FIG. 1B shows a chart of a depth of recess d (nm) compared to a deposition amount in first region R1 of substrate SW and etched according to a comparative process. As shown in FIG. 1B, a depth of recess d (nm) is compared with a deposition amount in first region R1 when substrate SW is etched according to the comparative process.

In the comparative process, a depth A of recess RC is etched. In an exemplary implementation, the depth A of recess RC is etched to be 20-40 nm. Then, a deposit DP is repeatedly formed on substrate SW alternately with the feeding of noble gas ions to the substrate SW. In an exemplary implementation, the deposit DP formed on substrate SW contains fluorine.

The recess RC is then etched to depth B, which in an exemplary implementation is 50-80 nm. To etch recess RC to depth B, the following is performed: (i) forming a first deposit on the first region R1 (5 nm or more), and then (ii) forming a second deposit containing fluorine on the substrate SW alternately with generating plasma from a noble gas and feeding the plasma to the substrate SW. Steps (i) and (ii) may be repeated one or more times until the process is complete. The steps to selectively process and etch the recess RC are performed at 120-180° C., but the processing is not limited to this range. In one example, steps are performed at 150° C.

Figure 1C:
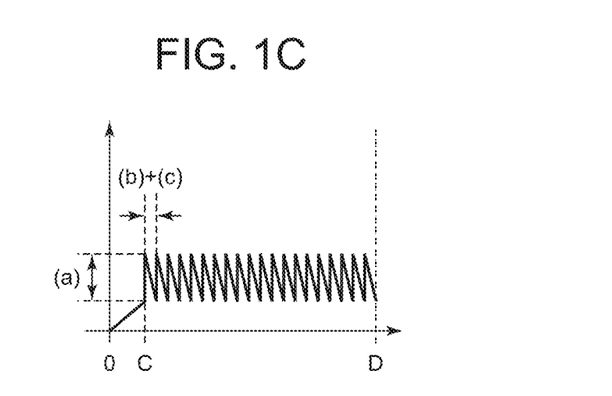
FIG. 1C shows a chart of a depth of recess compared to a deposition amount in a first region of a substrate shown in FIG. 1A and etched according to a process according to the present disclosure.

FIG. 1C shows a chart of depth of recess d compared to a deposition amount in first region R1 of substrate SW shown in FIG. 1A and etched according to an exemplary process according to the present disclosure. In the exemplary process according to the present disclosure, as shown in FIG. 1C, a depth of recess d (nm) is compared with a deposition amount in first region R1 when substrate SW is etched according to the exemplary process.

In the exemplary process, a depth C of recess RC is first etched. In an exemplary implementation, the depth C of recess RC is etched to be 10-20 nm, but is not limited thereto. Then, a deposit DP is repeatedly formed on substrate SW alternately with the feeding of noble gas ions to the substrate SW. In an exemplary implementation, the deposit DP formed on substrate SW contains fluorine.

The recess RC is then etched to depth D, which in an exemplary implementation is 80-100 nm. To etch recess RC to depth D, the following is performed: (a) forming a first deposit on the first region R1. This first deposit is formed to be thinner than the first deposit formed at (i) in the comparative process. Then, (b) forming a second deposit containing fluorine on the substrate SW, and then (c) generating plasma from a noble gas and feeding the plasma to the substrate SW. Steps (a), (b) and (c) are repeated in this order. The steps to selectively process and etch the recess RC are performed at 150-200° C., but the processing is not limited to this range. In one example, steps are performed at 170° C.

Figure 2:
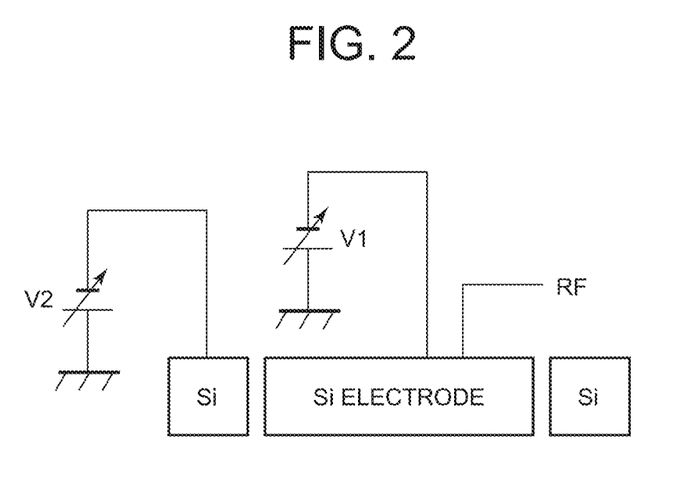
FIG. 2 shows an example condition for direct current superposition (DCS) near an upper electrode.

FIG. 2 shows an example condition for direct current superposition (DCS) near an upper electrode such as upper electrode 3 illustrated in FIG. 7 to be described later.

As shown in FIG. 2, a voltage V1 and an RF are both supplied to an Si electrode, while a voltage V2 is applied to Si. In an exemplary implementation, a condition for DCS is provided as follows:

Gas: noble gas (e.g., Ar)+H2 (optional);
Power: inner V1=−800 V and outer V2=−200 V (e.g., V1<V2<0 (V)); and
Pressure: 10 to 100 mTorr (e.g., 20 mTorr).

Further discussion of FIG. 2 will be provided later with respect to FIG. 5C and step STy.

Figure 3A:
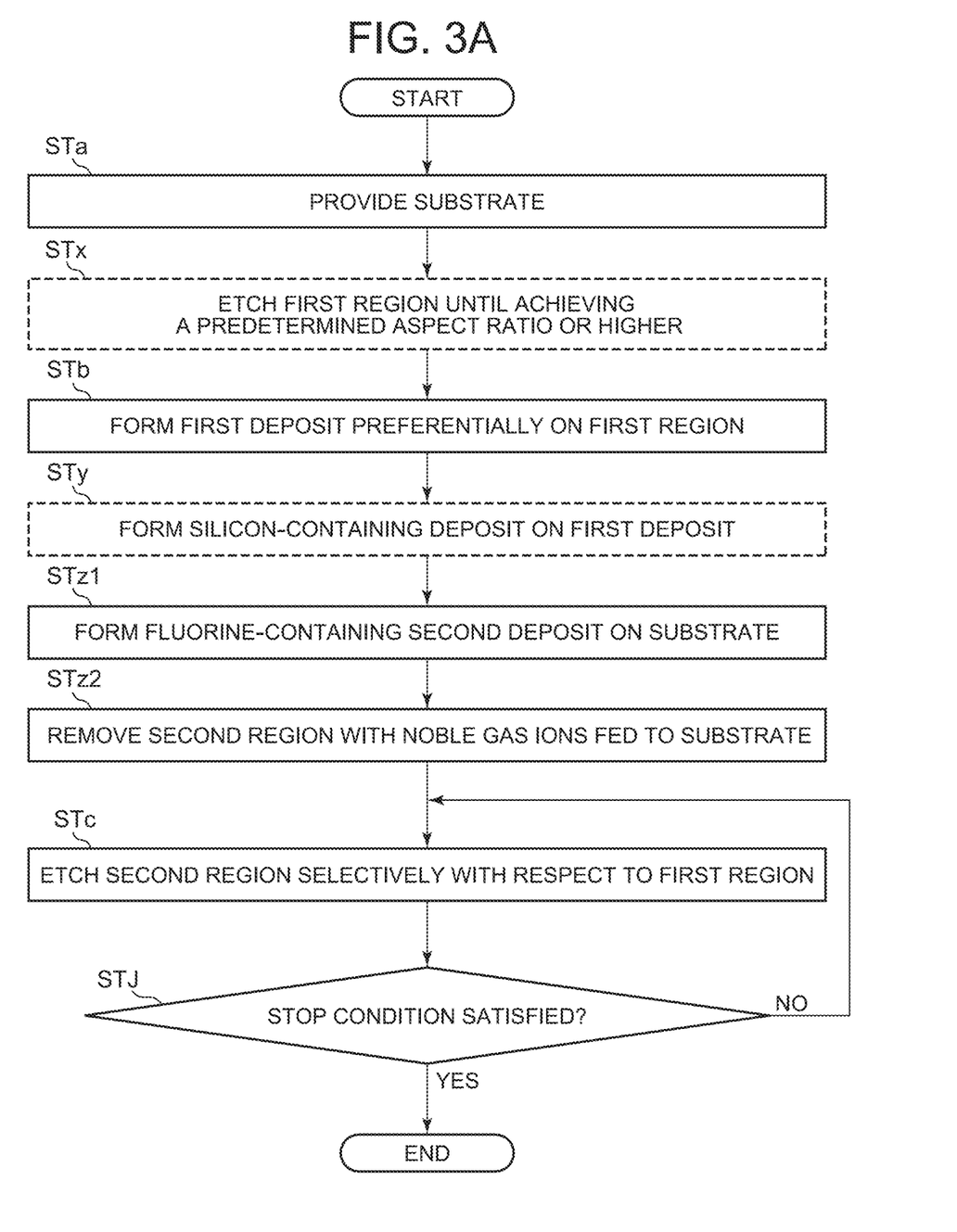
FIG. 3A is a flowchart of an etching method according to an exemplary embodiment.

FIG. 3A is a flowchart of an etching method according to an exemplary embodiment. The etching method shown in FIG. 3A (hereinafter referred to as a method MT) starts from step STa. In step STa, a substrate SW is placed on a substrate support in a substrate processing apparatus. The substrate support is accommodated in a chamber in the substrate processing apparatus. The substrate processing apparatus is illustrated in FIG. 7.

Figure 7:
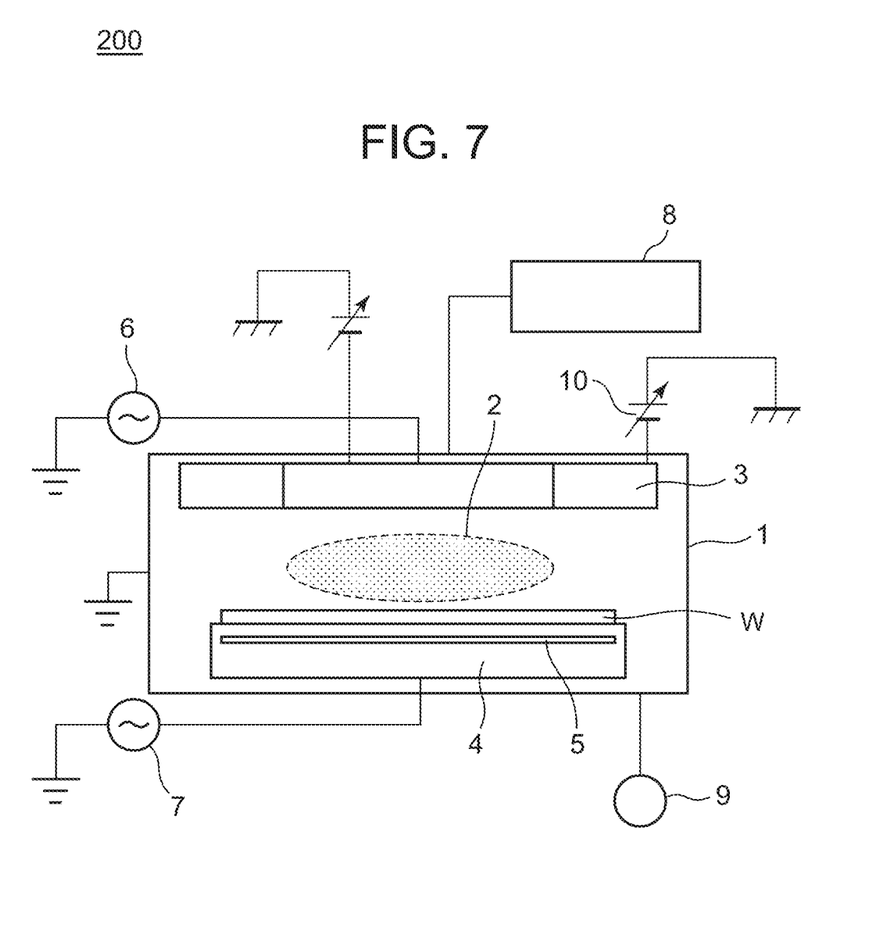
FIG. 7 illustrates an exemplary substrate processing apparatus in accordance with the present disclosure.

FIG. 7 illustrates an exemplary substrate processing apparatus in accordance with the present disclosure.

In particular, FIG. 7 illustrates a substrate processing apparatus 200, e.g., a capacitively coupled plasma (CCP) plasma system. While a CCP system is shown as an example, any other etching apparatus may also be used, such as inductively coupled plasma (ICP) apparatus and the like. The substrate processing apparatus 200 includes a reaction chamber 1, which is approximately cylindrical in shape and formed of, for example, aluminum. The reaction chamber 1 is connected to a ground potential. A film having plasma resistance is formed on the inner wall surface of the reaction chamber 1, and may be a film formed by an anodic oxidation treatment or a ceramic film, such as a film formed of yttrium oxide. When RF power is supplied to at least one of the upper electrode 3 and base 4 (serving as a lower electrode for generating plasma in the reaction chamber 1), a plasma 2 is developed between the upper electrode 3 and the base 4, with a substrate W to be processed therebetween. The plasma 2 is formed proximate to the substrate W, and the substrate W is held on an upper surface of an electrostatic chuck 5 as will be discussed in more detail below. The base 4 has an approximately disc shape and is conductive.

A gas source 8 includes a plurality of gas sources that are controlled via a corresponding series of flow rate controllers. The gas source 8 provides the gases via one or more gas lines to the reaction chamber 1.

The substrate processing apparatus 200 further includes a first RF power supply 6 that generates RF energy in an inclusive range of 27 MHz through 100 MHz, with 60 MHz being an exemplary frequency. The first RF power supply 6 is connected to the upper electrode 3 through a matching circuit that matches an output impedance of the first RF power supply 6 and an impedance of the upper electrode 3.

The etching plasma processing 200 further includes a second RF power supply 7 that generates RF energy for bias purposes so as to attract ions to the substrate W. An operational frequency of the second RF power supply 7 is lower than that for the first RF power supply 6, typically in a range of 300 kHz to 13.56 MHz. In an alternate embodiment, multiple RF power supplies 6 and 7 may be coupled to the same electrode (lower electrode 4).

The upper electrode 3 has a second power supply, which is a variable direct current (DC) power supply 10. The variable DC power supply 10 may also serve as a DC bias for the RF energy applied to the upper electrode from the first RF power supply 6. The variability of the DC power supply 10 allows for operational control over ion energy such that etch rates are controllable depending on the process being performed.

The RF energy generated by RF power supply 7 may be pulsed. When bias electric power is supplied to the base/lower electrode, etching mainly occurs. When bias electric power is not supplied to the base/lower electrode, deposition mainly occurs. A pulsed bias allows to separate the etch phase from the deposition phase. Etching occurs after a protective film is formed, and the sidewall of the recess is protected from side etch. Additionally, a change of duty of the pulse (bias on time/(bias on time+bias off time)) can control an etch/deposition balance. A longer bias off time can form protective film thicker, which leads to more protection. A longer bias on time increases an etch rate.

Figure 8:
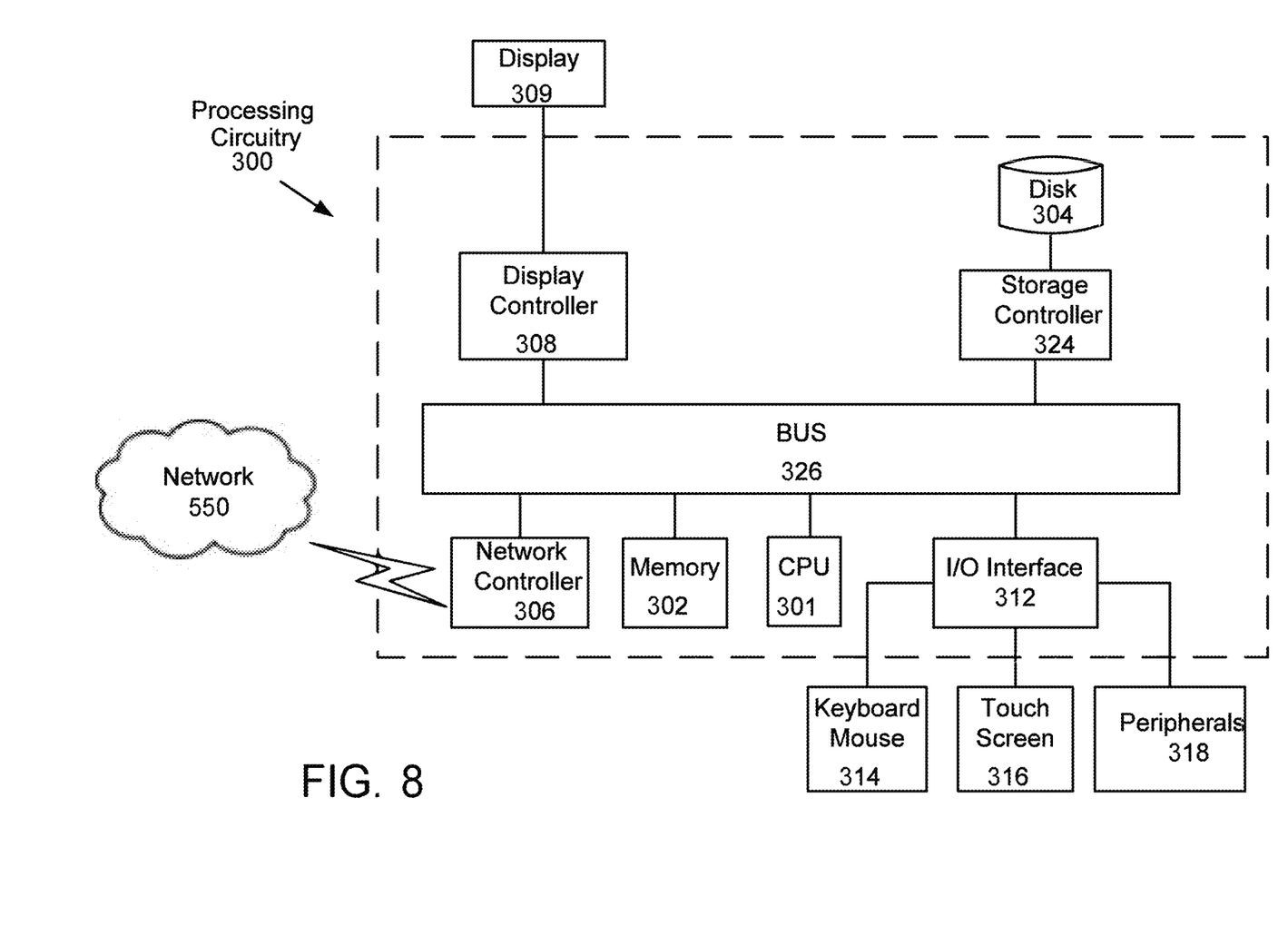
FIG. 8 illustrates exemplary processing circuitry that performs computer-based operations in accordance with the present disclosure.

In an embodiment, the substrate processing apparatus 200 may have dedicated control circuitry such as the processing circuitry illustrated in FIG. 8. The control circuitry executes a control program stored in memory, and controls each component of the substrate processing apparatus 200 based on recipe data stored in the storage device.

The substrate processing apparatus 200 includes an exhaust device 9 that is connected to an internal atmosphere of the reaction chamber 1. The exhaust device 9 includes a pressure controller, such as an automatic pressure control valve, a vacuum pump (e.g., turbo molecular pump), so as to controllably depressurize the reaction chamber 1 and exhaust gases from the reaction chamber 1.

In the substrate processing apparatus 200, the upper electrode 3 receives RF power for plasma generation. In some embodiments, the base 4 may receive RF power. The method according to the present disclosure is also applicable to a substrate processing apparatus different from the CCP plasma processing apparatus. More specifically, the method may be implemented using any plasma processing apparatus, such as an inductively coupled plasma processing apparatus or a plasma processing apparatus that generates plasma using surface waves such as microwaves.

Returning to the discussion of FIG. 3A, the substrate W includes a first region R1 and a second region R2. In an exemplary implementation, the first region R1 is formed from a material different from a material of the second region R2. The material of the first region R1 is free of oxygen and may contain silicon nitride. The material of the second region R2 contains silicon and oxygen and may contain silicon oxide. The material of the second region R2 may include a low dielectric constant material containing silicon, carbon, oxygen, and hydrogen.

Figure 5A:
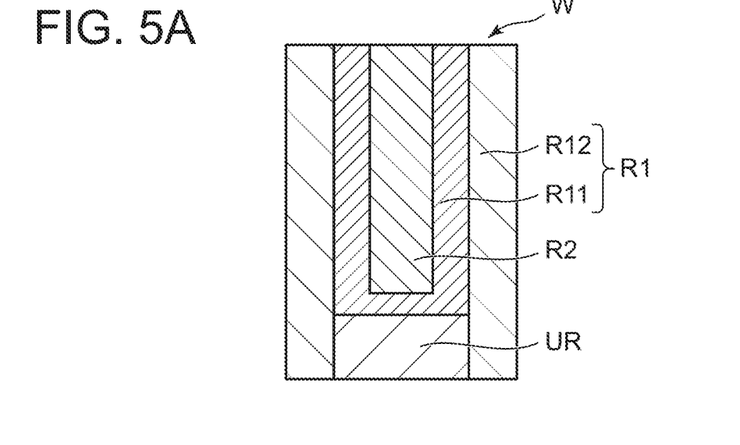
FIG. 5A shows an exemplary substrate provided at step STa in FIG. 3A.

FIG. 5A is a partially enlarged cross-sectional view of an exemplary substrate W to be processed with the etching method shown in FIG. 3A. The substrate W shown in FIG. 5A includes the first region R1 and the second region R2. The substrate W may further include an underlying region UR. The first region R1 of the substrate W shown in FIG. 5A includes a region R11 and a region R12. The region R11 is formed from silicon nitride and defines a recess. The region R11 is on the underlying region UR. The region R12 extends on either side of the region R11. The region R12 is formed from silicon nitride or silicon carbide. The second region R2 of the substrate W shown in FIG. 5A is formed from silicon oxide and is contained in the recess defined by the region R11. In other words, the second region R2 is surrounded by the first region R1. When the substrate W shown in FIG. 5A is processed with the method MT, the second region R2 is etched in a self-aligned manner.

Steps subsequent to step STa included in the method MT will now be described with reference to substrate W.

In some embodiments, step STx may be performed following step STa. In other embodiments, step STx is not performed and the process moves onto step STb. In step STx, first region R1 is etched until a predetermined aspect ratio or higher is reached. Further discussion of step STx will be discussed later with respect to FIGS. 3B and 6A-6D.

Figure 5B:
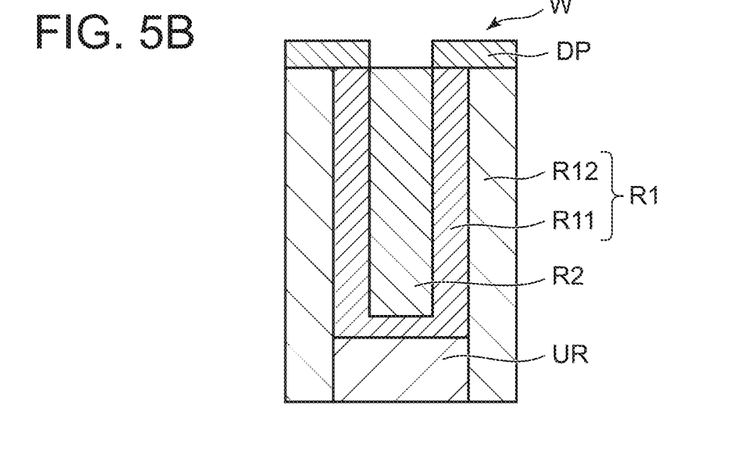
FIG. 5B shows first deposit DP formed in a first region of the substrate at step STb in FIG. 3A.
Figure 5C:
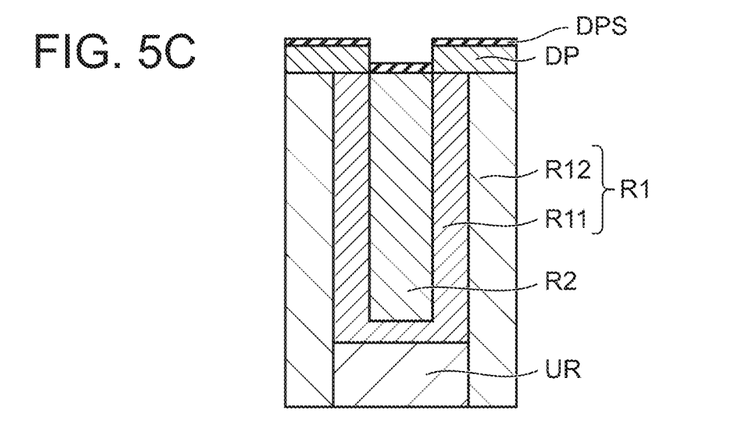
FIG. 5C shows silicon-containing deposit DPS formed on first deposit DP at step STy in FIG. 3A.

In step STb, a deposit DP is preferentially formed on the first region R1, as shown in FIG. 5B.

FIG. 5B shows first deposit DP formed in a first region of the substrate at step STb in FIG. 3A. The first deposit DP contains carbon. In an exemplary implementation, the first deposit DP is formed using plasma generated from a process gas containing carbon and being free of fluorine.

In step STb, plasma is generated from a process gas in the chamber in the substrate processing apparatus 200.

In an exemplary implementation, the process gas used in step STb may contain a first gas and a second gas. The process gas may further contain a noble gas such as an argon gas or a helium gas.

The first gas contains carbon and is free of fluorine. Examples of the first gas include a CO gas, a COS gas, a C2H2 gas, a C2H4 gas, a CH4 gas, a C2H6 gas, and a H2 gas.

The first gas may be free of hydrogen. The first gas may contain, for example, a carbon monoxide gas (CO gas) or a carbonyl sulfide gas (COS gas) as a carbon-containing fluorine-free gas.

The second gas may contain carbon and fluorine or hydrogen. Examples of such a second gas include a hydrofluorocarbon gas, a fluorocarbon gas, and a hydrocarbon gas. The hydrofluorocarbon gas may include, for example, a CHF3 gas, a CH3F gas, or a CH2F2 gas. The fluorocarbon gas may include, for example, a C4F6 gas. The second gas containing carbon and hydrogen may include, for example, a CH4 gas.

The first gas may have a higher flow rate than the second gas. The second gas has the ratio of its flow rate to the flow rate of the first gas of 0.2 or less. The first gas may contain a carbon-containing fluorine-free gas having a flow rate of 30 to 200 sccm inclusive. The first gas may contain a carbon-containing fluorine-free gas having a flow rate of 90 to 130 sccm inclusive. The process gas may contain a noble gas having a flow rate of 0 to 1,000 sccm inclusive. The process gas may contain a noble gas having a flow rate of 350 sccm or less.

The flow rate of each gas contained in the process gas may be determined depending on the volume of an internal space 10s of a chamber 10 or other factors. In step STb, a chemical species (carbon chemical species) contained in the plasma is fed to the substrate. The fed chemical species preferentially forms a deposit DP containing carbon on the first region R1 as shown in FIG. 5B.

In step STb using the process gas, a thin protective film is formed on side walls defining the recess, in addition to the deposit DP preferentially formed on the first region R1. The side walls are thus protected from the plasma.

The process gas used in step STb may be a mixture containing a CO gas and a hydrogen gas (H2 gas). Such a process gas allows the deposit DP to be preferentially formed on the first region R1. The deposit DP serves as a protective film that is highly resistant to etching in step STc. The ratio of the flow rate of the H2 gas to the total flow rate of the CO gas and the H2 gas contained in the process gas may be 1/19 to 2/17 inclusive. When a process gas having such a ratio is used, the deposit DP formed on the first region R1 has a side surface with a higher verticality.

In step STb, ions fed to the substrate W may have the energy of 0 to 70 eV inclusive. In this case, the deposit DP is less likely to narrow the opening of the recess.

In one embodiment, the substrate processing apparatus used in step STb may be a capacitively coupled plasma processing apparatus. When a capacitively coupled plasma processing apparatus is used, radio-frequency (RF) power for generating plasma may be provided to an upper electrode. In this case, the plasma can be formed in an area far from the substrate W. The RF power may have a frequency of 60 MHz or higher. In another embodiment, the substrate processing apparatus used in step STb may be an inductively coupled plasma processing apparatus.

In step STb, the deposit DP is preferentially formed on the first region R1. Step STb may thus be performed at least when the recess defined by the first region R1 and the second region R2 of the substrate W has an aspect ratio of 4 or lower.

The carbon chemical species generated from the process gas in step STb included in the method MT is selectively deposited on the first region R1. The carbon chemical species generated from the process gas is less likely to be deposited on the second region R2 containing oxygen. With the method MT, the second region R2 is etched while the deposit DP selectively remains on the first region R1. The method MT thus allows the second region R2 to be etched while protecting the first region R1 selectively with respect to the second region R2. With the method MT, the deposit DP is preferentially formed on the first region R1. This reduces blockage of the opening of the recess defined by the first region R1 and the second region R2.

A carbon chemical species generated from a CO gas in step STb is ionic. A CH4 gas or a CH3F gas tends to generate radicals such as CH2 or CHF. These radicals are highly reactive to be easily deposited isotropically on the surface of the substrate W. In contrast, an ionic chemical species is deposited on the substrate W anisotropically. In other words, an ionic chemical species adheres more to the upper surface of the first region R1 than to the wall surfaces defining the recess. Carbon monoxide is likely to be released from the surface of the substrate W. To cause carbon monoxide to be adsorbed on the surface of the substrate W, oxygen is to be removed from the surface of the substrate W with ions striking the surface. In addition, carbon monoxide with a simple structure is difficult to cross-link. To cause carbon monoxide to be deposited on the surface of the substrate W, a dangling bond is to form on the surface of the substrate W. The carbon chemical species generated from the CO gas in step STb is ionic. The chemical species can thus remove oxygen from the upper surface of the first region R1, form a dangling bond on the upper surface, and be selectively deposited on the first region R1.

In some embodiments, step STy may be performed following step STb. In other embodiments, step STy is not performed and the process moves onto step STz1. In step STy, a silicon-containing deposit DPS is formed on the first deposit DP and on second region R2, as shown in FIG. 5C.

In some embodiments, silicon-containing deposit DPS may be formed at step STy by using direct current superposition (DCS) near an upper electrode, as shown in FIG. 2. A Si-containing upper electrode is sputtered by ions in a noble gas generated by applying DC to the upper electrode while supplying the noble gas (e.g., Ar) into the chamber. Si and secondary electrons are produced. The substrate surface is exposed to the resultant Si and secondary electrons, which forms the silicon-containing deposit DPS.

In some other embodiments, silicon-containing deposit DPS may be formed at step STy by using plasma-enhanced chemical vapor deposition (PECVD). The silicon-containing deposit DPS is formed on the first deposit DP by providing radio frequency (RF) power to generate plasma while supplying a silicon-containing gas (e.g., $SiCl_4$) into the chamber.

Figure 5D:
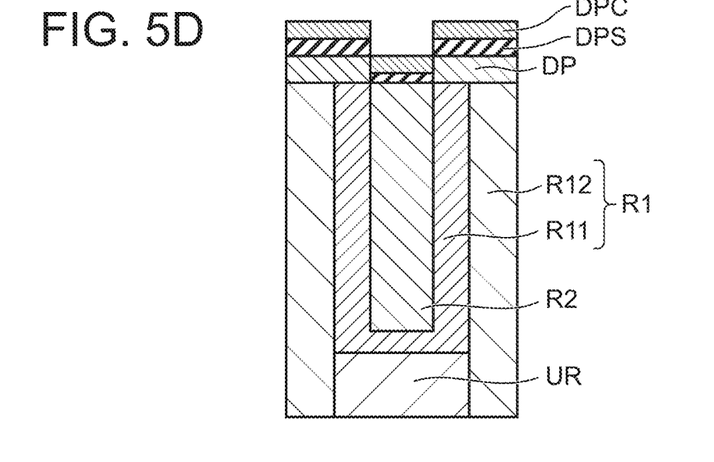
FIG. 5D shows second deposit DPC selectively formed on the silicon-containing deposit DPS at step STz1 in FIG. 3A.

In step STz1, a fluorine-containing second deposit DPC is formed on substrate W, as shown in FIG. 5D. In an exemplary implementation, second deposit DPC is formed upon silicon-containing deposit DPS in first region R1 and second region R2 when step STy is performed. In other implementations, second deposit DPC is formed upon deposit DP in region R1 as well as the silicon oxide film of second region R2 when step STy is not performed. In exemplary implementations, the second deposit DPC contains fluorine.

The second deposit DPC may formed using plasma generated from a fluorocarbon gas in the chamber of the substrate processing apparatus 200. Examples of the fluorocarbon gas include a CF4 gas, a C4F6 gas, and a C4F8 gas, but are not limited thereto. The process gas may further contain a noble gas such as an argon gas or a helium gas.

Figure 5E:
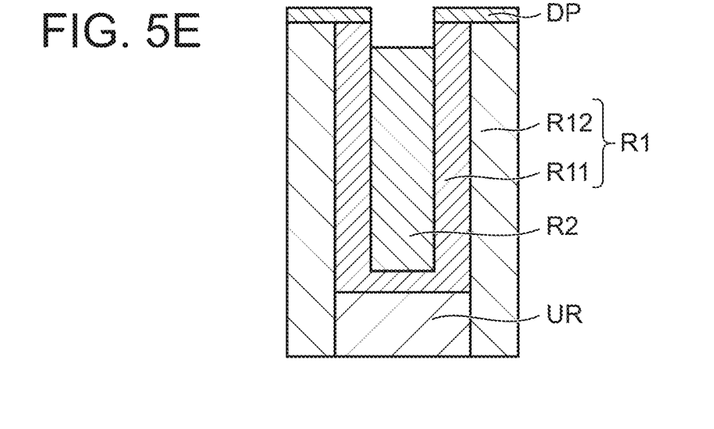
FIG. 5E shows the resulting substrate after the disclosure of ions at step STz2 in FIG. 3A.

In step STz2, plasma is generated from the noble gas in the chamber and a part of the second region R2 is removed with noble gas ions fed to substrate W, as shown in FIG. 5E. In particular, the ions in the noble gas are fed to substrate W, striking the second deposit DPC on the second region R2 to activate the second deposit DPC. The active species from the second deposit DPC reacts with the second region R2 to remove the part of the second region R2.

The silicon-containing deposit DPS and the second deposit DPC on the first region R1 are also removed. The first deposit DP on the first region R1 is also removed partially. In an exemplary implementation, the noble gas is an Ar gas, but may be another gas than an Ar gas. Step STz2 continues until the deposit DP on the first region R1 is not totally consumed.

After performance of step STz2, the process proceeds to step STc. In step STc, second region R2 is etched selectively with respect to first region R1. In particular, the second region R2 is selectively etched with noble gas ions fed to substrate W. In one embodiment, the second region R2 is etched using a chemical species contained in plasma generated from an etching gas. In this case, the plasma is generated from the etching gas in the chamber in an substrate processing apparatus. The etching gas is selected in accordance with the material of the second region R2. The etching gas may contain, for example, a fluorocarbon gas. The etching gas may further contain a noble gas such as an argon gas and an oxygen-containing gas such as an oxygen gas.

The substrate processing apparatus used in step STb may be used as the etching apparatus used in step STc. In this case, steps STb and STc are performed without removing the substrate W from the chamber in the substrate processing apparatus. In some embodiments, the substrate processing apparatus used in step STb may be different from the substrate processing apparatus used in step STc. In this case, the substrate W is transferred from the substrate processing apparatus used in step STb to the substrate processing apparatus used in step STc through a vacuum alone between steps STb and STc.

Figure 3B:
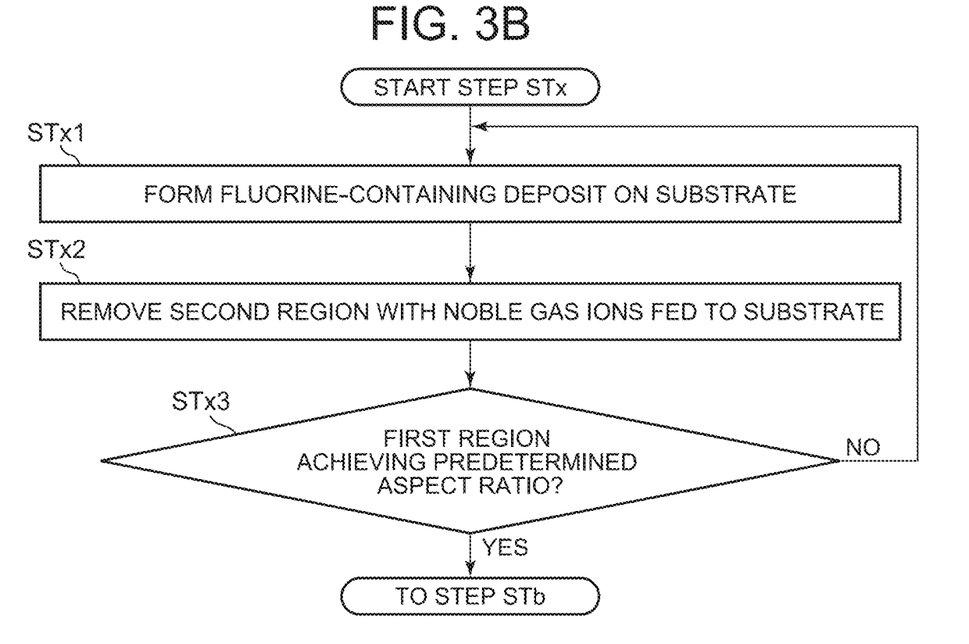
FIG. 3B is a flowchart of step STx in an exemplary embodiment that may be included in the etching method shown in FIG. 3A.
Figure 3C:
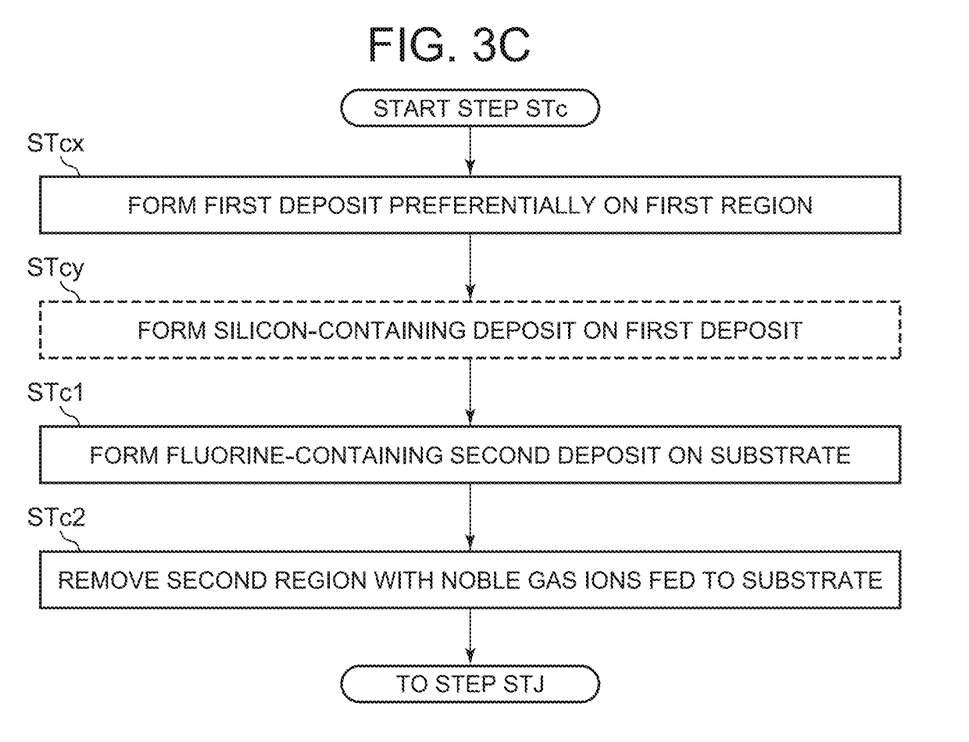
FIG. 3C is a flowchart of step STc in an exemplary embodiment that may be included in the etching method shown in FIG. 3A.

Further discussion with respect to step STc will be provided with respect to FIG. 3C.

Finally, the method MT proceeds to step STJ, where it is determined whether a stop condition is satisfied. In an exemplary implementation, processing circuitry performs this determination. A detailed discussion of the processing circuitry will be provided later with respect to FIG. 8.

In a case that it is determined at step STJ that a stop condition is not satisfied, then the process returns back to step STc in order to repeat step STc. In a case that the stop condition is determined to have been satisfied, method MT is complete.

Figure 5F:
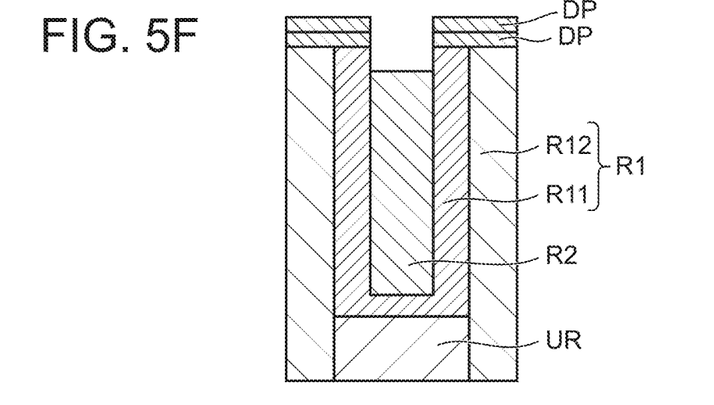
FIG. 5F shows first deposit DP selectively formed on the first region at step STcx in FIG. 3C.
Figure 5G:
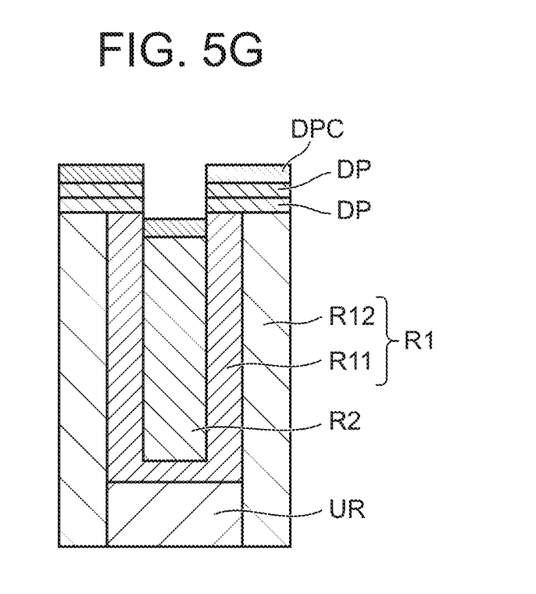
FIG. 5G shows a resulting substrate after repeating of steps STcx, STc1 and STc2 until a stop condition is satisfied.

In an exemplary implementation of step STJ, the stop condition is satisfied when a process count of step STc reaches a count threshold. The count threshold may be a predetermined number or may be set based on user input or other parameters. When the stop condition is not satisfied in step STJ, then the process returns to STc to repeat step STc. In particular, step STc is again performed to etch the second region R2 as shown in FIGS. 5F-5G and described with respect to FIG. 3C.

Figure 6A:
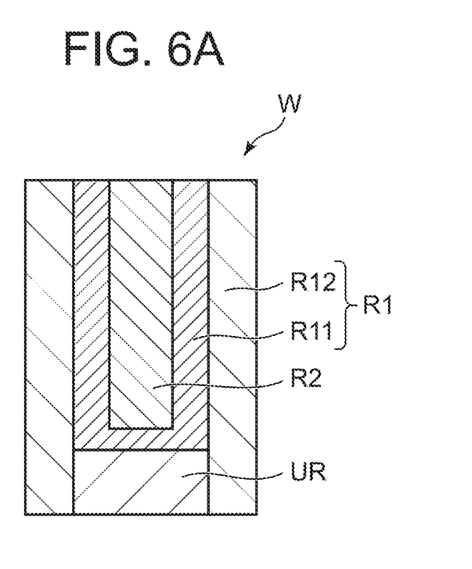
FIG. 6A shows an exemplary substrate provided at step STa in FIG. 3A.

The discussion will now return to step STx, which is shown in detailed in FIG. 3B. Step STx is performed after substrate W is provided at step STa. Such a substrate W is shown in FIG. 6A, which corresponds with substrate W shown in FIG. 5A.

Figure 6B:
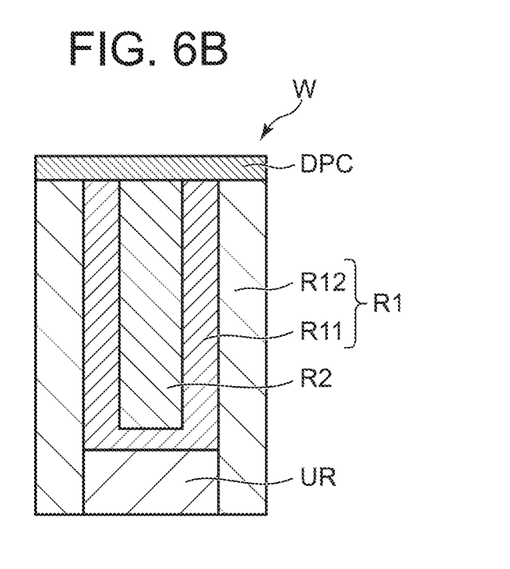
FIG. 6B shows deposit DPC formed on the substrate at step STx1 in FIG. 3B.

The process of step STx begins at step STx1, where a fluorine-containing deposit DPC is formed on substrate W, as shown in FIG. 6B. This fluorine-containing deposit DPC may be a same material as deposit DPC used in step STz1 and shown in FIG. 5D. In an exemplary implementation, the fluorine-containing deposit DPC is formed in first region R1 and in second region R2. The fluorine-containing deposit DPC may formed using plasma generated from a fluorocarbon gas in the chamber of the substrate processing apparatus. Examples of the fluorocarbon gas include a CF4 gas, a C4F6 gas, and a C4F8 gas, but are not limited thereto. The process gas may further contain a noble gas such as an argon gas or a helium gas.

When the step STx1 is performed in the substrate processing apparatus 200, the processing gas is supplied into reaction chamber 1 from the gas source 8. Further, in the step STx1, the high frequency power is supplied to the base 4 from the second RF power supply 7. Furthermore, in the step STx1, a pressure of the space within the reaction chamber 1 is set to be a preset pressure. By way of example, the pressure of the space within the reaction chamber 1 is set to be in a range of 5 mTorr (0.6667 Pa) to 80 mTorr (10.67 Pa), but other pressures may also be set. Moreover, in the step STx1, a distance between the upper electrode 3 and the upper surface of the base 4 is set to be in a range of 20 mm to 90 mm. Thus, plasma of the processing gas is generated within the reaction chamber 1, and the substrate W mounted on the base 4 is exposed to the plasma. Further, in the step STx1, a voltage from the power supply 10 may be applied to the upper electrode 3. The voltage applied from the power supply 10 to the upper electrode 3 may be −150 V or less. That is, the voltage applied from the power supply 10 to the upper electrode 3 may be a negative voltage having an absolute value of 150 V or more. While the step STx1 is performed, the operations of the respective components of the substrate processing apparatus 200 can be controlled by processing circuitry to be discussed with reference to FIG. 8.

At the beginning of the step STx1, active species of atoms and/or molecules generated from fluorocarbon, for example, active species of fluorine collide with the first region R1 and the second region R2 of the substrate W. Thus, a deposit DPC including fluorine is formed on the first region R1 and the second region R2. A film thickness of the deposit DPC is increased as a processing time of performing the step STx1 is increased.

Figure 6C:
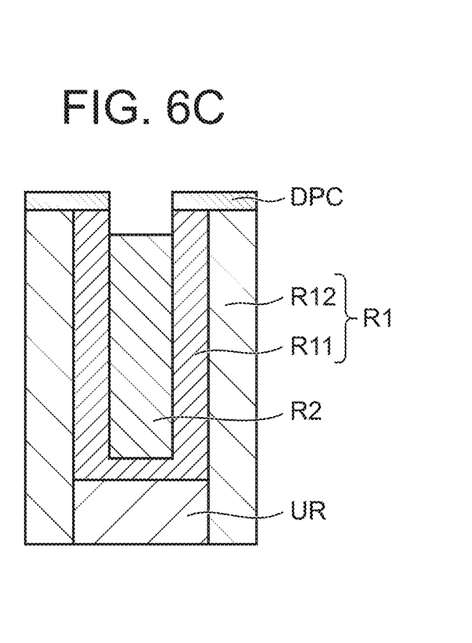
FIG. 6C shows the resulting substrate after the disclosure of ions at step STx2 in FIG. 3B.

After step STx1, step STx2 is performed. In step STx2, second region R2 is removed with noble gas ions being fed to substrate W. This is shown in FIG. 6C. In an exemplary implementation, the ions of the noble gas strike the deposit DPC on the second region R2 to activate the deposit DPC in the second region R2. The active species from the deposit DPC reacts with the second region R2 to remove the second region R2. In some implementations, the deposit DPC on the first region R1 may be removed partially or entirely. The noble gas is, for example, an Ar gas, but may be other than an Ar gas.

A processing time for the step STx2 and a processing time for the step STx1 can be appropriately set. In the example embodiment, the processing time for the step STx1 may be set to have a ratio in a range of 30% to 70% of the total processing time for the step STx1 and the step STx2. However, other ratios may be used.

In the step STx2, the high frequency power is applied to the base 4 from the RF power supply 7 as in step STx1. Moreover, in the step STx2, a pressure of the space within the reaction chamber 1 is set as in step STx1. Furthermore, in the step STx2, a distance between the upper electrode 3 and the upper surface of the base 4 is set as in step STx1. Thus, plasma is generated within the reaction chamber 1, and the substrate W mounted on the base 4 is exposed to the plasma. Further, in the step STx2, the voltage from the power supply 10 may be applied to the upper electrode 3 as in step STx1.

In the step STx2, active species, for example, ions of rare gas atoms, collide with the deposit DP. As a result, as depicted in FIG. 6C, the second region R2 is etched with the fluorocarbon radical in the deposit DP. Further, the film thickness of the deposit DP is reduced through the step STx2. Further, in the step STx2, as depicted in FIG. 6C, the film thickness of the deposit DPC on the first region R1 is also reduced.

After step STx2, step STx3 is performed. In step STx3, it is determined whether the first region R1 has achieved a predetermined aspect ratio with respect to second region R2. In an exemplary implementation, the processing circuitry illustrated in FIG. 8 performs this determination.

In a case that it is determined at step STx3 that the predetermined aspect ratio is not achieved, then the process returns back to step STx1 in order to repeat steps STx1 and STx2. In a case that the predetermined aspect ratio is determined to have been achieved, then step STx is completed and the method MT proceeds to step STb.

Figure 6D:
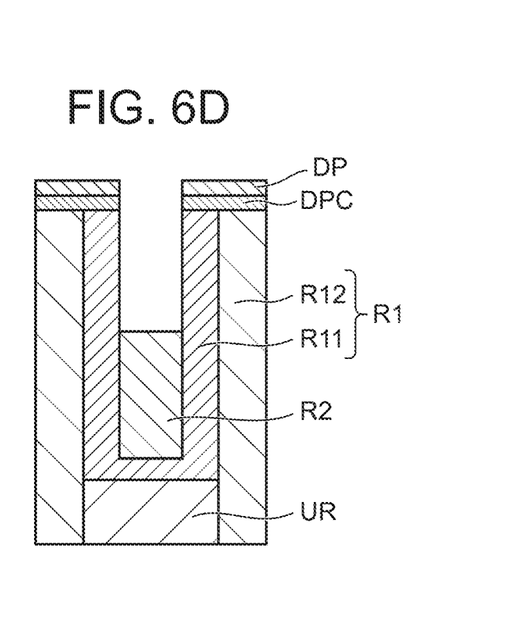
FIG. 6D shows first deposit DP preferentially formed on the first region at step STcx in FIG. 3C.

FIG. 6D illustrates a condition of substrate W after step STb is completed following completion of step STx. As shown in FIG. 6D, a first deposit DP is preferentially formed on the first region R1 that has achieved the predetermined aspect ratio or higher with respect to second region R2.

The selectivity of first region R1 is higher when step STx is performed than of first region R1 when step STx is not performed. In particular, the selectivity of first region R1 is higher when step STx is performed due to the resulting predetermined aspect ratio between first region R1 and second region R2. In other words, the first deposit DP forms less on the second region R2 than on the first region R1 when step STx is performed.

The discussion will now return to step STc, which is shown in detailed in FIG. 3C. Step STc is performed after step STz2. Additionally, step STc may be repeated if it is determined at step STJ that a stop condition is not satisfied. Such substrate W is shown in FIG. 5E.

The process of step STc begins at step STcx, where first deposit DP is preferentially formed on first region R1, as shown in FIG. 5F. The first deposit DP in this step may be of the same material as the deposit DP described with reference to step STb and FIG. 5B. However, the first deposit DP deposited in step STcx may have a thickness different from the deposit DP shown in FIG. 5B and deposited in step STb. Additionally, the processing of step STcx may be performed using a pressure condition and/or a process duration different from the conditions in which step STb were performed.

After completion of step STcx, step STcy may be performed. Step STcy is an optional step in which a silicon-containing deposit DPS is preferentially formed on the first deposit DP formed in step STcx. In some implementations, however, step STcy is skipped and silicon-containing deposit DPS is not formed upon first deposit DP.

Next, the process proceeds to step STc1, where a fluorine-containing second deposit DPC is formed on substrate W, as shown in FIG. 5G. The fluorine-containing deposit DPC is formed in both first region R1 and in second region R2. In implementations where silicon-containing deposit DPS is formed on the first deposit DP in step STcy, the fluorine-containing deposit DPC is formed upon silicon-containing deposit DPS. In implementations where step STcy is skipped and silicon-containing deposit DPS is not formed, the fluorine-containing deposit DPC is formed upon on the first deposit DP in first region R1.

Next, the process proceeds to step STc2, where second region R2 is etched by noble gas ions being fed to substrate W. In particular, the second region R2 is etched selectively with respect to first region R1 with noble gas ions fed to substrate W.

After completion of step STc2, step STc is completed and method MT proceeds to step STJ. As previously discussed, it may be determined at step STJ that a stop condition is not satisfied. If not satisfied, step STc is repeated, resulting in the further etching of region R2.

Figure 5H:
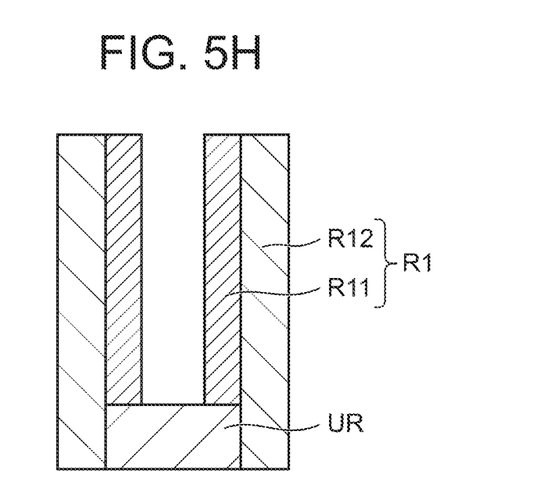
FIG. 5H shows the removal of the deposit by ashing after the etching of second region R2 is complete.

FIG. 5H shows substrate W after deposit DP is removed by ashing. In some implementations, the deposit DP may be removed from first region R1 by ashing after etching of second region R2 is complete. This step may be optionally performed after step STJ. In one embodiment, the deposit DP is removed by etching using a chemical species contained in plasma generated from an ashing gas. In this case, the plasma is generated from the ashing gas in the chamber of an ashing apparatus. The ashing gas may contain an oxygen-containing gas, such as an oxygen gas. The ashing gas may be a mixture containing a N2 gas and a H2 gas.

Figure 4:
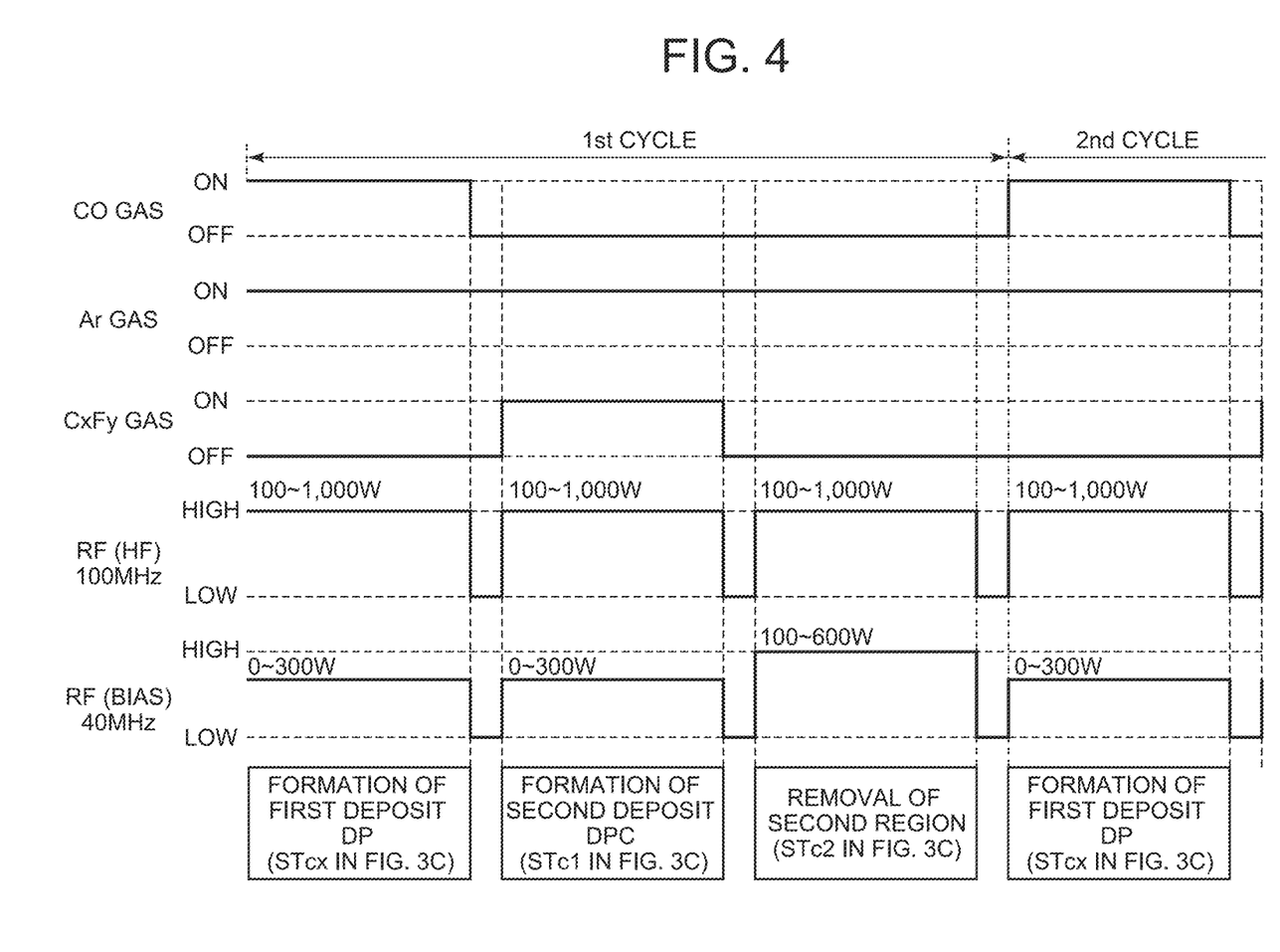
FIG. 4 shows a timing chart for the formation of deposits on the substrate W in step STc in FIGS. 3A and 3C.

FIG. 4 shows a timing chart for the formation of deposits on the substrate W in step STc in FIGS. 3A and 3C. As shown in FIG. 4, the supply of various gasses and RF biases are turned on and off during steps STcx, STc1 and STc2. The supply of Ar gas is kept on throughout all of step STc.

The supply of CO gas is on during the formation of the first deposit DP in first region R1 in step STcx. The supply of CO gas is then turned off prior to and for the duration of steps STc1 and STc2. The supply of CO gas is then turned back on prior to and for step STcx in a repeat of step STc.

The supply of CxFy gas is off during step STcx. The supply of CxFy gas is then turned for the duration of step STc1 and the supply of CxFy gas is then turned off prior to and for the duration of step STc2. The supply of CxFy gas is kept off for step STcx in any repeat of step STc.

An RF (HF) at 100 MHz of 100-1000 W is applied for the duration of each of steps STcx, STc1 and STc2. The RF is dropped in between each step and reapplied at the start of and for the duration of each step.

An RF bias at 40 MHz of 0-300 W is applied for the duration of each of steps STcx and STc1. The RF bias is dropped in between each step. An RF bias at 40 MHz of 100-600 W is applied for the duration of step STc2 and is dropped after the end of step STc2 prior to the beginning of any repeat of step STc.

FIG. 8 is a block diagram of processing circuitry for performing computer-based operations described herein. FIG. 8 illustrates processing circuitry 300 that may be used to control any computer-based and cloud-based control processes, descriptions or blocks in flowcharts can be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art. The various elements, features, and processes described herein may be used independently of one another or may be combined in various ways. All possible combinations and sub-combinations are intended to fall within the scope of this disclosure.

In FIG. 8, the processing circuitry 300 includes a CPU 301 which performs one or more of the control processes described above/below. The process data and instructions may be stored in memory 302. These processes and instructions may also be stored on a storage medium disk 304 such as a hard drive (HDD) or portable storage medium or may be stored remotely. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the processing circuitry 300 communicates, such as a server or computer. The processes may also be stored in network based storage, cloud-based storage or other remote accessible storage and executable by processing circuitry 300.

Further, the claimed advancements may be provided as a utility disclosure, background daemon, or component of an operating system, or combination thereof, executing in conjunction with CPU 301 and an operating system such as Microsoft Windows, UNIX, Solaris, LINUX, Apple MAC-OS and other systems known to those skilled in the art.

The hardware elements in order to achieve the processing circuitry 300 may be realized by various circuitry elements. Further, each of the functions of the above described embodiments may be implemented by circuitry, which includes one or more processing circuits. A processing circuit includes a particularly programmed processor, for example, processor (CPU) 301, as shown in FIG. 8. A processing circuit also includes devices such as an disclosure specific integrated circuit (ASIC) and conventional circuit components arranged to perform the recited functions.

In FIG. 8, the processing circuitry 300 includes a CPU 301 which performs the processes described above. The processing circuitry 300 may be a general-purpose computer or a particular, special-purpose machine. In one embodiment, the processing circuitry 300 becomes a particular, special-purpose machine when the processor 301 is programmed to perform ESC in-situ replacement by controlling voltages and robot arms to replace the ESC without exposing the reaction chamber 1 to an external atmosphere. The processing circuitry 300 may be in or locally communicable to substrate processing apparatus 200. In some embodiments, processing circuitry 300 may be remote from substrate processing apparatus 200, providing processing instructions to substrate processing apparatus 200 via network 550.

Alternatively, or additionally, the CPU 301 may be implemented on an FPGA, ASIC, PLD or using discrete logic circuits, as one of ordinary skill in the art would recognize. Further, CPU 301 may be implemented as multiple processors cooperatively working in parallel to perform the instructions of the inventive processes described above.

The processing circuitry 300 in FIG. 8 also includes a network controller 306, such as an Intel Ethernet PRO network interface card from Intel Corporation of America, for interfacing with network 550. As can be appreciated, the network 550 can be a public network, such as the Internet, or a private network such as an LAN or WAN network, or any combination thereof and can also include PSTN or ISDN sub-networks. The network 550 can also be wired, such as an Ethernet network, or can be wireless such as a cellular network including EDGE, 3G and 4G wireless cellular systems. The wireless network can also be Wi-Fi, Bluetooth, or any other wireless form of communication that is known.

The processing circuitry 300 further includes a display controller 308, such as a graphics card or graphics adaptor for interfacing with display 309, such as a monitor. A general purpose I/O interface 312 interfaces with a keyboard and/or mouse 314 as well as a touch screen panel 316 on or separate from display 309. General purpose I/O interface also connects to a variety of peripherals 318 including printers and scanners.

The general-purpose storage controller 324 connects the storage medium disk 304 with communication bus 326, which may be an ISA, EISA, VESA, PCI, or similar, for interconnecting all of the components of the processing circuitry 300. A description of the general features and functionality of the display 309, keyboard and/or mouse 314, as well as the display controller 308, storage controller 324, network controller 306, and general purpose I/O interface 312 is omitted herein for brevity as these features are known.

The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in circuitry on a single chipset.

The functions and features described herein may also be executed by various distributed components of a system. For example, one or more processors may execute these system functions, wherein the processors are distributed across multiple components communicating in a network. The distributed components may include one or more client and server machines, which may share processing, in addition to various human interface and communication devices (e.g., display monitors, smart phones, tablets, personal digital assistants (PDAs)). The network may be a private network, such as a LAN or WAN, or may be a public network, such as the Internet. Input to the system may be received via direct user input and received remotely either in real-time or as a batch process. Additionally, some implementations may be performed on modules or hardware not identical to those described. Accordingly, other implementations are within the scope that may be claimed.

The disclosures of US 2015/0243522, US 2018/0151333 and JP 2021-029988 are incorporated by reference in their entirety.

Having now described embodiments of the disclosed subject matter, it should be apparent to those skilled in the art that the foregoing is merely illustrative and not limiting, having been presented by way of example only. Thus, although particular configurations have been discussed herein, other configurations can also be employed. Numerous modifications and other embodiments (e.g., combinations, rearrangements, etc.) are enabled by the present disclosure and are within the scope of one of ordinary skill in the art and are contemplated as falling within the scope of the disclosed subject matter and any equivalents thereto. Features of the disclosed embodiments can be combined, rearranged, omitted, etc., within the scope of the invention to produce additional embodiments. Furthermore, certain features may sometimes be used to advantage without a corresponding use of other features. Accordingly, Applicant(s) intend(s) to embrace all such alternatives, modifications, equivalents, and variations that are within the spirit and scope of the disclosed subject matter.

What is claimed is:

1. A substrate processing method for processing a substrate including a first region and a second region with compositions different from each other, the substrate processing method comprising:
   (a) preferentially forming, by a substrate processing apparatus, a first deposit on the first region;
   (b) forming, after (a), a second deposit on the second region, the second deposit containing fluorine and the second deposit being different from the first deposit; and
   (c) removing, after (b), the second deposit and at least a part of the second region, wherein
   performance of step (a) starts in response to a recess defined by the first region and the second region of the substrate achieving an aspect ratio of 1 or higher, and
   steps (a)-(c) are repeated, in order, in a case that a stop condition is not satisfied.

2. The substrate processing method according to claim 1, further comprising:
   determining, by processing circuitry of the substrate processing apparatus, whether the stop condition is satisfied; and
   in a case that the processing circuitry determines that the stop condition is not satisfied, repeating steps (a)-(c) in order.

3. The substrate processing method according to claim 1, further comprising:
   applying a direct-current (DC) voltage to an upper electrode, after step (a) and before step (b).

4. The substrate processing method according to claim 3, wherein the DC voltage is applied using a capacitively coupled plasma (CCP) processing apparatus.

5. The substrate processing method according to claim 1, wherein
the first region contains SiN or Si, and
the second region contains SiO2.

6. The substrate processing method according to claim 1, wherein step (a) or (b) is performed by plasma-enhanced chemical vapor deposition (PECVD).

7. The substrate processing method according to claim 1, wherein step (c) is performed using plasma generated from a noble gas.

8. The substrate processing method according to claim 1, further comprising:
supplying a carbon-containing gas during step (a).

9. The substrate processing method according to claim 8, wherein the carbon-containing gas is a CO gas.

10. The substrate processing method according to claim 1, wherein a fluorocarbon gas is supplied during step (b).

11. The substrate processing method according to claim 1, wherein the first deposit formed in step (a) in a first cycle of the substrate processing method has a larger thickness than another first deposit formed in a subsequent performance of step (a) in another cycle of the substrate processing method.

12. The substrate processing method according to claim 1, wherein a duration of any one of step (a), step (b) and step (c) is adjusted for each cycle of the substrate processing method.

13. The substrate processing method according to claim 12, wherein the first deposit formed in step (a) in an (N+1)th cycle has a larger thickness than another first deposit formed in step (a) in an N-th cycle, with N being a natural number.

14. The substrate processing method according to claim 12, wherein the duration of step (a) in an (N+1)th cycle is longer than the duration of step (a) in the N-th cycle.

15. The substrate processing method according to claim 1, wherein a bias power in the (N+1)th cycle is greater than another bias power in the N-th cycle.

16. The substrate processing method according to claim 1, wherein steps (a), (b) and (c) are performed in a same chamber.

17. The substrate processing method according to claim 1, wherein an inductively coupled plasma (ICP) processing apparatus is used.

18. A substrate processing method for processing a substrate including a first region and a second region with compositions different from each other, the substrate processing method comprising:
(a) preferentially forming, by a substrate processing apparatus, a first deposit on the first region;
(b) forming after (a), a second deposit on the second region, the second deposit containing fluorine and the second deposit being different from the first deposit; and
(c) removing, after (b), the second deposit and at least a part of the second region, wherein
steps (b) and (c) are performed in a chamber different from a chamber used for performance of step (a), and
steps (a)-(c) are repeated, in order, in a case that a stop condition is not satisfied.

* * * * *